(12) United States Patent
Liu

(10) Patent No.: US 12,130,523 B2
(45) Date of Patent: Oct. 29, 2024

(54) ELECTROSTATIC PROTECTION CIRCUIT, POWER MANAGEMENT CHIP, AND DISPLAY TERMINAL

(71) Applicant: TCL CHINA STAR OPTOELECTRONICS TECHNOLOGY CO., LTD., Guangdong (CN)

(72) Inventor: Fangyun Liu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,792

(22) PCT Filed: Dec. 20, 2021

(86) PCT No.: PCT/CN2021/139544
§ 371 (c)(1),
(2) Date: Dec. 24, 2021

(87) PCT Pub. No.: WO2023/108670
PCT Pub. Date: Jun. 22, 2023

(65) Prior Publication Data
US 2024/0036406 A1 Feb. 1, 2024

(30) Foreign Application Priority Data

Dec. 15, 2021 (CN) .......................... 202111532736.X

(51) Int. Cl.
*H01L 23/60* (2006.01)
*G02F 1/1362* (2006.01)
*H01L 27/02* (2006.01)

(52) U.S. Cl.
CPC ........ *G02F 1/136204* (2013.01); *H01L 23/60* (2013.01); *H01L 27/0288* (2013.01); *G02F 2202/22* (2013.01)

(58) Field of Classification Search
None
See application file for complete search history.

(56) References Cited

U.S. PATENT DOCUMENTS 10,193,554 B1 * 1/2019 Sharma ............... H01L 27/0248
2012/0099232 A1 * 4/2012 Kuroyabu ........... H01L 27/0266
361/56

(Continued)

FOREIGN PATENT DOCUMENTS

| CN | 1522090 A | 8/2004 |
| CN | 103633637 A | 3/2014 |

(Continued)

OTHER PUBLICATIONS

International Search Report in International application No. PCT/CN2021/139544, mailed on Aug. 30, 2022.

(Continued)

*Primary Examiner* — Benjamin P Sandvik
(74) *Attorney, Agent, or Firm* — PV IP PC; Wei Te Chung

(57) ABSTRACT

An electrostatic protection circuit, a power management chip, and a display terminal are provided. The electrostatic protection circuit includes a level shift unit and a power management unit. The electrostatic protection circuit also includes a clamping module. An input terminal of the clamping module receives an electrostatic detection signal. An output terminal of the clamp module outputs a fault detection signal. The output terminal of the clamp module continues to output a high electrical potential when the electrostatic detection signal transits from a low electrical potential to the high electrical potential until the power management unit stops operating.

20 Claims, 1 Drawing Sheet

(56) References Cited

U.S. PATENT DOCUMENTS

| | | | | |
|---|---|---|---|---|
| 2015/0049403 A1* | 2/2015 | de Raad | ........... | H03K 19/00315 |
| | | | | 361/56 |
| 2017/0162092 A1 | 6/2017 | Kim et al. | | |
| 2018/0226792 A1* | 8/2018 | Segervall | ............... | H02H 9/046 |
| 2021/0048466 A1* | 2/2021 | Xue | ........................ | G06F 21/75 |
| 2021/0376599 A1* | 12/2021 | Meng | ................. | G01R 31/2851 |

FOREIGN PATENT DOCUMENTS

| | | | |
|---|---|---|---|
| CN | 106712753 | A | 5/2017 |
| CN | 207765146 | U | 8/2018 |
| CN | 109817133 | A | 5/2019 |
| CN | 110518561 | A | 11/2019 |
| CN | 111243473 | A | 6/2020 |
| CN | 211856719 | U | 11/2020 |
| CN | 113096611 | A | 7/2021 |

OTHER PUBLICATIONS

Written Opinion of the International Search Authority in International application No. PCT/CN2021/139544, mailed on Aug. 30, 2022.

Chinese Office Action issued in corresponding Chinese Patent Application No. 202111532736.X dated Jul. 26, 2022, pp. 1-7.

\* cited by examiner

ELECTROSTATIC PROTECTION CIRCUIT, POWER MANAGEMENT CHIP, AND DISPLAY TERMINAL

FIELD OF INVENTION

The present application relates to display technologies, and more particularly, to an electrostatic protection circuit, a power management chip, and a display terminal.

BACKGROUND OF INVENTION

The power management chip of display terminal products such as television (TV) or narrow band Internet of things (NB-IoT) includes a level shifter unit and a power management unit (PMIC). The level shifter unit is configured to output an electrostatic detection signal (LS_FLT), the power management unit is configured to receive the fault detection signal (PMIC_FLT). The fault detection signal and the electrostatic detection signal are conducted.

Generally, in a case of excessively high electrostatic discharge (ESD), an electrical potential of the electrostatic detection signal of the level shift unit will be pulled up. Correspondingly, an electrical potential of the fault detection signal will be pulled up, the power management unit will stop supplying power, and the screen will be darkened accordingly. An electrical potential of the electrostatic detection signal will be pulled down to return to normal when an ESD specification drops, and an electrical potential of the fault detection signal will also be pulled down. The power management unit is normally powered, and the screen output is normal. However, if an excessively high ESD interference sources repeatedly touches the screen or the whole machine, the screen may be constantly bright and dark, with flashing screens, blurry screens, etc., which provides people a bad screen illusion. Therefore, it is necessary to improve this defect.

SUMMARY OF INVENTION

The embodiment of the application provides an electrostatic protection circuit, which is configured to solve a technical problem of poor display such as a flickering screen and a blurry screen when the screen or the whole machine is repeatedly touched by an excessively high ESD interference source of the display terminal product of the prior art.

The embodiment of the application provides electrostatic protection circuit, including: a level shift unit configured to output an electrostatic detection signal; and
  a power management unit configured to receive a fault detection signal;
  wherein the electrostatic protection circuit further includes a clamping module, an input terminal of the clamping module receives the electrostatic detection signal, an output terminal of the clamping module outputs the fault detection signal, and wherein the output terminal of the clamp module continues to output the high electrical potential when the electrostatic detection signal transits from a low electrical potential to a high electrical potential until the power management unit stops operating.

In the electrostatic protection circuit provided by the embodiment of the present application, the level shift unit includes an electrostatic voltage detection module and a judgment module, and wherein the electrostatic voltage detection module is configured to detect an electrostatic voltage, and wherein the judgment module stores a first threshold, and wherein the judgment module is configured to judge a magnitude relationship between the electrostatic voltage and the first threshold, and wherein the electrostatic detection signal is at the low electrical potential when the electrostatic voltage is less than the first threshold, and wherein the electrostatic detection signal is at the high electrical potential when the electrostatic voltage is greater than or equal to the first threshold.

In the electrostatic protection circuit provided by the embodiment of the present application the power management unit supplies power normally when the fault detection signal is at the low electrical potential, and wherein the power management unit stops supplying power when the fault detection signal is at the high electrical potential.

In the electrostatic protection circuit provided by the embodiment of the present application, the clamping module is composed of a D flip-flop, and wherein a clock signal terminal of the D flip-flop is an input terminal of the clamping module, and wherein an output terminal of the D flip-flop is the output terminal of the clamping module, and wherein the input terminal of the D flip-flop receives a constant voltage high electrical potential signal.

In the electrostatic protection circuit provided by the embodiment of the present application, the electrostatic protection circuit further includes a switch module, and wherein an input terminal of the switch module receives the electrostatic detection signal, and wherein a first output terminal of the switch module is electrically connected to the clock signal terminal of the D flip-flop, and wherein the second output terminal of the switch module outputs the fault detection signal;
  wherein the input terminal of the switch module is electrically connected to the first output terminal or the second output terminal.

In the electrostatic protection circuit provided by the embodiment of the present application, the switch module is composed of a register, and wherein the input terminal of the switch module is electrically connected to the first output terminal when a setting bit of the register is at the low electrical potential, and wherein the input terminal of the switch module is electrically connected to the second output terminal when the setting bit of the register is at the high electrical potential.

In the electrostatic protection circuit provided by the embodiment of the present application, the clamping module and the switch module are both positioned in the power management unit.

In the electrostatic protection circuit provided by the embodiment of the present application, the clamping module and the switch module are both positioned in the level shift unit.

One embodiment of the application provides a power management chip, including an electrostatic protection circuit, wherein the electrostatic protection circuit includes:
  a level shift unit configured to output an electrostatic detection signal; and
  a power management unit configured to receive a fault detection signal;
  wherein the electrostatic protection circuit further includes a clamping module, an input terminal of the clamping module receives the electrostatic detection signal, an output terminal of the clamping module outputs the fault detection signal, and wherein the output terminal of the clamp module continues to output the high electrical potential when the electrostatic detection signal transits from a low electrical potential to a high electrical potential until the power management unit stops operating.

In the power management chip provided by the embodiment of the present application, the level shift unit includes an electrostatic voltage detection module and a judgment module, and wherein the electrostatic voltage detection module is configured to detect an electrostatic voltage, and wherein the judgment module stores a first threshold, and wherein the judgment module is configured to judge a magnitude relationship between the electrostatic voltage and the first threshold, and wherein the electrostatic detection signal is at the low electrical potential when the electrostatic voltage is less than the first threshold, and wherein the electrostatic detection signal is at the high electrical potential when the electrostatic voltage is greater than or equal to the first threshold.

In the power management chip provided by the embodiment of the present application, the power management unit supplies power normally when the fault detection signal is at the low electrical potential, and wherein the power management unit stops supplying power when the fault detection signal is at the high electrical potential.

In the power management chip provided by the embodiment of the present application, the clamping module is composed of a D flip-flop, and wherein a clock signal terminal of the D flip-flop is an input terminal of the clamping module, and wherein an output terminal of the D flip-flop is the output terminal of the clamping module, and wherein the input terminal of the D flip-flop receives a constant voltage high electrical potential signal.

One embodiment of the present application also provides a display terminal, including a display panel and a power management chip, wherein the power management chip includes an electrostatic protection circuit, and wherein the electrostatic protection circuit includes:
 a level shift unit configured to output an electrostatic detection signal; and
 a power management unit configured to receive a fault detection signal;
 wherein the electrostatic protection circuit further includes a clamping module, an input terminal of the clamping module receives the electrostatic detection signal, an output terminal of the clamping module outputs the fault detection signal, and wherein the output terminal of the clamp module continues to output the high electrical potential when the electrostatic detection signal transits from a low electrical potential to a high electrical potential until the power management unit stops operating.

In the display terminal provided by the embodiment of the present application, the level shift unit includes an electrostatic voltage detection module and a judgment module, and wherein the electrostatic voltage detection module is configured to detect an electrostatic voltage, and wherein the judgment module stores a first threshold, and wherein the judgment module is configured to judge a magnitude relationship between the electrostatic voltage and the first threshold, and wherein the electrostatic detection signal is at the low electrical potential when the electrostatic voltage is less than the first threshold, and wherein the electrostatic detection signal is at the high electrical potential when the electrostatic voltage is greater than or equal to the first threshold.

In the display terminal provided by the embodiment of the present application, the power management unit supplies power normally when the fault detection signal is at the low electrical potential, and wherein the power management unit stops supplying power when the fault detection signal is at the high electrical potential.

In the display terminal provided by the embodiment of the present application, the clamping module is composed of a D flip-flop, and wherein a clock signal terminal of the D flip-flop is an input terminal of the clamping module, and wherein an output terminal of the D flip-flop is the output terminal of the clamping module, and wherein the input terminal of the D flip-flop receives a constant voltage high electrical potential signal.

In the display terminal provided by the embodiment of the present application, the electrostatic protection circuit further includes a switch module, and wherein an input terminal of the switch module receives the electrostatic detection signal, and wherein a first output terminal of the switch module is electrically connected to the clock signal terminal of the D flip-flop, and wherein the second output terminal of the switch module outputs the fault detection signal;
 wherein the input terminal of the switch module is electrically connected to the first output terminal or the second output terminal.

In the display terminal provided by the embodiment of the present application, the switch module is composed of a register, and wherein the input terminal of the switch module is electrically connected to the first output terminal when a setting bit of the register is at the low electrical potential, and wherein the input terminal of the switch module is electrically connected to the second output terminal when the setting bit of the register is at the high electrical potential.

In the display terminal provided by the embodiment of the present application, the clamping module and the switch module are both positioned in the power management unit.

In the display terminal provided by the embodiment of the present application, the clamping module and the switch module are both positioned in the level shift unit.

An electrostatic protection circuit provided by the embodiment of the present application includes a level shift unit and a power management unit. The level shift unit is configured to output an electrostatic detection signal. The power management unit is configured to receive a fault detection signal. The electrostatic protection circuit also includes a clamping module. An input terminal of the clamping module receives the electrostatic detection signal. An output terminal of the clamping module outputs a fault detection signal. The output terminal of the clamp module continues to output the high electrical potential when the electrostatic detection signal transits from a low electrical potential to a high electrical potential until the power management unit stops operating. The present application uses a clamping module to receive electrostatic detection signals and output the fault detection signal. In an excessively high ESD environment, the clamp module can continue to output the high electrical potential when the electrostatic detection signal transits from a low electrical potential to a high electrical potential, until the power management unit stops operating, and the screen shuts down, to prevent abnormal screens such as flickering and blurring.

DESCRIPTION OF FIGURES

In order to more clearly illustrate the technical solutions in the embodiments of the present application, the following will briefly introduce the figures that need to be used in the description of the embodiments.

DETAILED DESCRIPTION OF EMBODIMENTS

The technical solutions in the embodiments of the present application will be clearly and completely described below in conjunction with the figures in the embodiments of the present application. In the figures, for clarity and ease of understanding and description, sizes and thicknesses of the components shown in the figures are not to scale.

Figure 1:
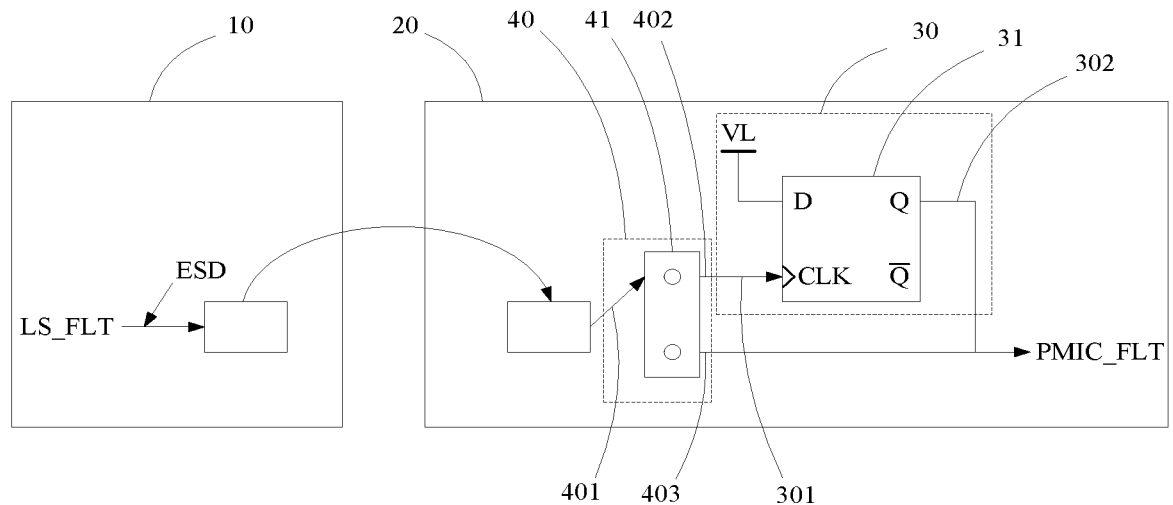
FIG. 1 is a schematic diagram of a basic structure of an electrostatic protection circuit provided by one embodiment of the present application.

As shown in FIG. 1, FIG. 1 is a schematic diagram of a basic structure of an electrostatic protection circuit provided by one embodiment of the present application. The electrostatic protection circuit includes a level shift unit 10 and a power management unit 20. The level shift unit 10 is configured to output an electrostatic detection signal LS_FLT. The power management unit 20 is configured to receive a fault detection signal PMIC_FLT. The electrostatic protection circuit further includes a clamping module 30, an input terminal 301 of the clamping module 30 receives the electrostatic detection signal LS_FLT. An output terminal 302 of the clamping module 30 outputs the fault detection signal PMIC_FLT. The output terminal 302 of the clamp module 30 continues to output the high electrical potential when the electrostatic detection signal LS_FLT transits from a low electrical potential to a high electrical potential until the power management unit 20 stops operating It should be noted that the power management chip is divided into two parts, one part is the level shifter 10, which is configured to provide gate on array (GOA) driving signals. Another part is the power management unit 20 (PMIC), which is configured to power supply.

In one embodiment, the level shift unit 10 includes an electrostatic voltage detection module (not shown) and a judgment module (not shown). The electrostatic voltage detection module is configured to detect an electrostatic voltage. The judgment module stores a first threshold. The judgment module is configured to judge a magnitude relationship between the electrostatic voltage and the first threshold. The electrostatic detection signal LS_FLT is at the low electrical potential when the electrostatic voltage is less than the first threshold. The electrostatic detection signal LS_FLT is at the high electrical potential when the electrostatic voltage is greater than or equal to the first threshold.

It should be noted that when an interference source contacts a screen of the display terminal or a whole machine, the charge will be transferred to the display terminal or discharged through the display terminal. The electrostatic voltage is a voltage between the interference source and the display terminal. In addition, the first threshold value is stored in the judgment module in the level shift unit 10, and can be input through external command operation. A value of the first threshold value is determined according to a demand of a product. The first threshold value is different for different products. Specifically, different types of products can be bound to their corresponding first thresholds to form a threshold table, which is stored in the judgment module, and different products are judged with different first thresholds.

In one embodiment, the power management unit 20 is configured to receive the fault detection signal PMIC_FLT. The fault detection signal PMIC_FLT is used to control a power supply enable terminal of the power management unit 20. The power management unit 20 supplies power normally when the fault detection signal PMIC_FLT is at the low electrical potential. The power management unit stops supplying power when the fault detection signal is at the high electrical potential.

Specifically, the electrostatic detection signal LS_FLT and the fault detection signal PMIC_FLT are both low under normal operating conditions. When an external abnormality occurs, such as excessive ESD, over-current, over-voltage, etc., the fault detection signal PMIC_FLT will be set to high electrical potential, and the power management unit 20 will start the protection action, stop the power supply, and the screen will be power off (black screen).

It is understandable that the fault detection signal PMIC_FLT in the prior art is directly connected to the static detection signal LS_FLT through the wire. In a case of repeated interference from excessive ESD, the static detection signal LS_FLT will continuously jump from the low electrical potential to the high electrical potential, from the high electrical potential to the low electrical potential. The fault detection signal PMIC_FLT will also continuously jump from low electrical potential to high electrical potential, and from high electrical potential to low electrical potential along with the static detection signal LS_FLT electrical potential, will cause the power management unit 20 to continuously stop power supply and normal power supply. Therefore, it will cause the screen to be constantly dark and bright, that is, poor display such as flickering screen and blurry screen will occur. In the present application, the clamping module 30 is set to receive the electrostatic detection signal LS_FLT and output the fault detection signal PMIC_FLT. In an excessively high ESD environment, when the electrostatic detection signal LS_FLT transitions from the low electrical potential to the high electrical potential, the clamp module 30 can continuously output the high electrical potential. Specifically, the clamp module 30 will continue to output the high electrical potential when the electrostatic detection signal LS_FLT transitions from the low electrical potential to the high electrical potential first time. Even if the ESD suddenly disappears later, the static detection signal LS_FLT is restored from the high electrical potential to the low electrical potential, the clamp module 30 will continue to output the high electrical potential, to make the fault detection signal PMIC_FLT is clamped to the high electrical potential until the power management unit 20 stops operating or the screen is powered off. Therefore, the use of the electrostatic protection circuit provided by the present application can prevent abnormal screens such as flickering screen and blurry screen.

In one embodiment, the clamping module 30 is composed of a D flip-flop 31. A clock signal terminal CLK of the D flip-flop 31 is an input terminal 301 of the clamping module 30. An output terminal Q of the D flip-flop 31 is the output terminal 302 of the clamping module 30. The input terminal D of the D flip-flop 31 receives a constant voltage high electrical potential signal VL.

It should be noted that the D flip-flop 31 is an information storage device with a memory function and two stable states. The D flip-flop 31 flips only on a rising edge of a pulse of the clock signal terminal CLK (positive transition 0→1). A secondary state $Q_{n+1}$ of the D flip-flop 31 depends on a state of the input terminal D before a rising edge of the pulse of the clock signal terminal CLK arrives. That is, the secondary state $Q_{n+1}$=D. Therefore, it has two stable states: set to 0 and set to 1. Due to a maintenance blocking effect during the clock signal terminal CLK=1 (high electrical potential), a data state of the input terminal D changes during the clock signal terminal CLK=1 (high electrical potential), which will not affect an output status of the D flip-flop 31.

Specifically, the electrical potential of the output terminal Q is equal to the electrical potential of the input terminal D before the clock signal terminal CLK undergoes a positive transition, that is, the constant voltage high electrical potential signal VL, when a electrostatic detection signal LS_FLT transitions from the low electrical potential to the high electrical potential for the first time, that is, the clock signal terminal CLK of the D flip-flop 31 undergoes a positive transition (rising edge). The second state Qn+1 of the D flip-flop 31 still maintains the constant voltage high electrical potential signal VL when the ESD disappears suddenly and the electrostatic detection signal LS_FLT returns from the high electrical potential to the low electrical potential, to make the fault detection signal PMIC_FLT is clamped to the high electrical potential until the power management unit 20 stops operating or the screen is powered off, therefore the occurrence of abnormalities such as flickering and blurring can be prevent.

In one embodiment, the voltage value of the constant voltage high electrical potential signal VL is greater than or equal to 4 volts and less than or equal to 6 volts, generally 5V.

In one embodiment, the electrostatic protection circuit further includes a switch module 40. An input terminal 401 of the switch module 40 receives the electrostatic detection signal LS_FLT. A first output terminal 402 of the switch module 40 is electrically connected to the clock signal terminal CLK of the D flip-flop 31. The second output terminal 403 of the switch module 40 outputs the fault detection signal PMIC_FLT. The input terminal 401 of the switch module 40 is electrically connected the first output terminal 402 or the second output terminal 403.

It is understandable that, the clock signal terminal CLK of the D flip-flop 31 receives the electrostatic detection signal LS_FLT when the input terminal 401 of the switch module 40 is electrically connected to the first output terminal 402, which can realize the clamp module 30 can continue to output the high electrical potential when the electrostatic detection signal LS_FLT transitions from low electrical potential to high electrical potential, until the power management unit 20 stops working or shuts down the screen after power off, therefore, abnormal screens such as flashing screen and blurry screen can be prevented. The electrostatic detection signal LS_FLT is conducted to the fault detection signal PMIC_FLT when the input terminal 401 of the switch module 40 is electrically connected to the second output terminal 403. Therefore, the different needs of different customers can be meet, and the circuit structure is simple and practical.

In one embodiment, the switch module 40 is composed of a register 41. The input terminal 401 of the switch module 40 is electrically connected to the first output terminal 402, that is, the D flip-flop 31 is gated, when a setting bit Reg00h[0] of the register 41 is at the low electrical potential, that is, when Reg00h[0]=0. The rising edge of the pulse of the clock signal terminal CLK of the D flip-flop 31 is triggered, and the fault detection signal PMIC_FLT=Q=D=1 (VL is a constant voltage high level signal) when the electrostatic detection signal LS_FLT is pulled to 1 by an excessively high ESD, that is, when the electrostatic detection signal LS_FLT transitions from the low electrical potential to the high electrical potential. Even when the ESD specification drops LS_FLT=0, the second state Qn+1=D=1 of the D flip-flop 31, and the fault detection signal PMIC_FLT is clamped to 1. The power management unit 20 ensures there is no output until the screen is powered off. Further, the screen is normally operated when turned on again. The input terminal 401 of the switch module 40 is electrically connected to the second output terminal 403 when the setting bit Reg00h[0] of the register 41 is at the high electrical potential, that is when Reg00h[0]=1.

It should be noted that the state of the setting bit of the register 41 can be written as 0 or 1 through an external command, and different written values correspond to different circuit connection forms. If there is a requirement for black out the screen in an excessively high ESD environment for some specific customers, the setting bit Reg00h[0] of register 41 can be written to 0 through an external command. If there is no special requirement from the customer, directly set the setting bit Reg00h[0] of register 41 can be directly set 1. Therefore, needs of different customers can be meet.

In one embodiment, the clamping module 30 and the switch module 40 are both positioned in the power management unit 20. In other embodiments, the clamping module 30 and the switch module 40 may also be positioned in the level shift unit 10.

Figure 2:
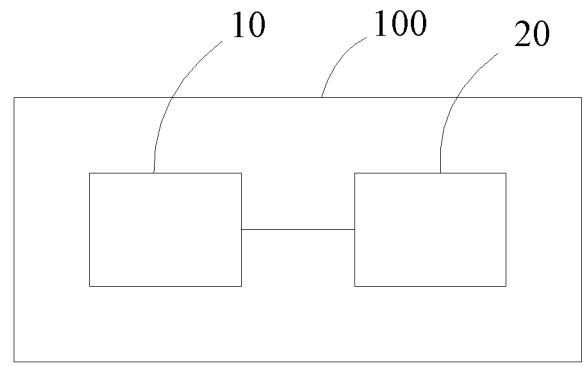
FIG. 2 is a structural block diagram of a power management chip provided by one embodiment of the present application.

Next, please refer to FIG. 2, FIG. 2 is a structural block diagram of a power management chip provided by one embodiment of the present application. The power management chip 100 includes the electrostatic protection circuit described in FIG. 1, and the electrostatic protection circuit includes a level shift unit 10 and a power management unit 20. The level shift unit 10 is configured to output an electrostatic detection signal. The power management unit 20 is configured to receive a fault detection signal. The electrostatic protection circuit also includes a clamping module (not shown). An input terminal of the clamping module receives the electrostatic detection signal, an output terminal of the clamping module outputs the fault detection signal, and wherein the output terminal of the clamp module continues to output the high electrical potential when the electrostatic detection signal transits from a low electrical potential to a high electrical potential until the power management unit 20 stops operating. Please refer to FIG. 1 and related descriptions for the specific structure and working principle of the electrostatic protection circuit, which will not be repeated here.

One embodiment of the present application also provides a display terminal, including the display panel and the power management chip 100 described in FIG. 2. The display panel may be a liquid crystal display panel or an organic light emitting diode display panel. The display terminal provided by the embodiments of the present application may be a product or component with a display function such as a mobile phone, a tablet computer, a notebook computer, a television, a digital camera, a navigator, and the like.

In summary, an electrostatic protection circuit provided by the embodiment of the present application includes a level shift unit and a power management unit. The level shift unit is configured to output an electrostatic detection signal. The power management unit is configured to receive a fault detection signal. The electrostatic protection circuit also includes a clamping module. An input terminal of the clamping module receives the electrostatic detection signal. An output terminal of the clamping module outputs a fault detection signal. The output terminal of the clamp module continues to output the high electrical potential when the electrostatic detection signal transits from a low electrical potential to a high electrical potential until the power management unit stops operating. The present application uses a clamping module to receive electrostatic detection signals and output the fault detection signal. In an excessively high ESD environment, the clamp module can continue to output the high electrical potential when the electrostatic detection signal transits from a low electrical potential to a high electrical potential, until the power management unit stops operating, and the screen shuts down, to prevent abnormal screens such as flickering and blurring. It solves the technical problems of poor display such as flickering screen and blurring screen when excessively high ESD interference sources repeatedly touch or contact the screen or the whole machine in the prior art display terminal products.

The electrostatic protection circuit, the power management chip, and the display terminal provided by the embodiments of the present application are described in detail above. It should be understood that the exemplary embodiments described herein should only be regarded as descriptive, and used to help understand the method and core ideas of the present application, but not to limit the present application.

What is claimed is:

1. An electrostatic protection circuit, comprising:
a level shift unit configured to output an electrostatic detection signal; and
a power management unit configured to receive a fault detection signal;
wherein the electrostatic protection circuit further comprises a clamping module, an input terminal of the clamping module receives the electrostatic detection signal, an output terminal of the clamping module outputs the fault detection signal, and wherein the output terminal of the clamp module continues to output a high electrical potential when the electrostatic detection signal transits from a low electrical potential to the high electrical potential until the power management unit stops operating.

2. The electrostatic protection circuit according to claim 1, wherein the level shift unit comprises an electrostatic voltage detection module and a judgment module, and wherein the electrostatic voltage detection module is configured to detect an electrostatic voltage, and wherein the judgment module stores a first threshold, and wherein the judgment module is configured to judge a magnitude relationship between the electrostatic voltage and the first threshold, and wherein the electrostatic detection signal is at the low electrical potential when the electrostatic voltage is less than the first threshold, and wherein the electrostatic detection signal is at the high electrical potential when the electrostatic voltage is greater than or equal to the first threshold.

3. The electrostatic protection circuit according to claim 2, wherein the power management unit supplies power normally when the fault detection signal is at the low electrical potential, and wherein the power management unit stops supplying power when the fault detection signal is at the high electrical potential.

4. The electrostatic protection circuit according to claim 3, wherein the clamping module is composed of a D flip-flop, and wherein a clock signal terminal of the D flip-flop is an input terminal of the clamping module, and wherein an output terminal of the D flip-flop is the output terminal of the clamping module, and wherein the input terminal of the D flip-flop receives a constant voltage high electrical potential signal.

5. The electrostatic protection circuit according to claim 4, wherein the electrostatic protection circuit further comprises a switch module, and wherein an input terminal of the switch module receives the electrostatic detection signal, and wherein a first output terminal of the switch module is electrically connected to the clock signal terminal of the D flip-flop, and wherein the second output terminal of the switch module outputs the fault detection signal;
wherein the input terminal of the switch module is electrically connected to the first output terminal or the second output terminal.

6. The electrostatic protection circuit according to claim 5, wherein the switch module is composed of a register, and wherein the input terminal of the switch module is electrically connected to the first output terminal when a setting bit of the register is at the low electrical potential, and wherein the input terminal of the switch module is electrically connected to the second output terminal when the setting bit of the register is at the high electrical potential.

7. The electrostatic protection circuit according to claim 6, wherein the clamping module and the switch module are both positioned in the power management unit.

8. The electrostatic protection circuit according to claim 6, wherein the clamping module and the switch module are both positioned in the level shift unit.

9. A power management chip, comprising an electrostatic protection circuit, wherein the electrostatic protection circuit comprises:
a level shift unit configured to output an electrostatic detection signal; and
a power management unit configured to receive a fault detection signal;
wherein the electrostatic protection circuit further comprises a clamping module, an input terminal of the clamping module receives the electrostatic detection signal, an output terminal of the clamping module outputs the fault detection signal, and wherein the output terminal of the clamp module continues to output a high electrical potential when the electrostatic detection signal transits from a low electrical potential to the high electrical potential until the power management unit stops operating.

10. The power management chip according to claim 9, wherein the level shift unit comprises an electrostatic voltage detection module and a judgment module, and wherein the electrostatic voltage detection module is configured to detect an electrostatic voltage, and wherein the judgment module stores a first threshold, and wherein the judgment module is configured to judge a magnitude relationship between the electrostatic voltage and the first threshold, and wherein the electrostatic detection signal is at the low electrical potential when the electrostatic voltage is less than the first threshold, and wherein the electrostatic detection signal is at the high electrical potential when the electrostatic voltage is greater than or equal to the first threshold.

11. The power management chip according to claim 10, wherein the power management unit supplies power normally when the fault detection signal is at the low electrical potential, and wherein the power management unit stops supplying power when the fault detection signal is at the high electrical potential.

12. The power management chip according to claim 11, wherein the clamping module is composed of a D flip-flop, and wherein a clock signal terminal of the D flip-flop is an input terminal of the clamping module, and wherein an output terminal of the D flip-flop is the output terminal of the clamping module, and wherein the input terminal of the D flip-flop receives a constant voltage high electrical potential signal.

13. A display terminal, comprising a display panel and a power management chip, wherein the power management chip comprises an electrostatic protection circuit, and wherein the electrostatic protection circuit comprises:
   a level shift unit configured to output an electrostatic detection signal; and
   a power management unit configured to receive a fault detection signal;
   wherein the electrostatic protection circuit further comprises a clamping module, an input terminal of the clamping module receives the electrostatic detection signal, an output terminal of the clamping module outputs the fault detection signal, and wherein the output terminal of the clamp module continues to output a high electrical potential when the electrostatic detection signal transits from the low electrical potential to a high electrical potential until the power management unit stops operating.

14. The display terminal according to claim 13, wherein the level shift unit comprises an electrostatic voltage detection module and a judgment module, and wherein the electrostatic voltage detection module is configured to detect an electrostatic voltage, and wherein the judgment module stores a first threshold, and wherein the judgment module is configured to judge a magnitude relationship between the electrostatic voltage and the first threshold, and wherein the electrostatic detection signal is at the low electrical potential when the electrostatic voltage is less than the first threshold, and wherein the electrostatic detection signal is at the high electrical potential when the electrostatic voltage is greater than or equal to the first threshold.

15. The display terminal according to claim 14, wherein the power management unit supplies power normally when the fault detection signal is at the low electrical potential, and wherein the power management unit stops supplying power when the fault detection signal is at the high electrical potential.

16. The display terminal according to claim 15, wherein the clamping module is composed of a D flip-flop, and wherein a clock signal terminal of the D flip-flop is an input terminal of the clamping module, and wherein an output terminal of the D flip-flop is the output terminal of the clamping module, and wherein the input terminal of the D flip-flop receives a constant voltage high electrical potential signal.

17. The display terminal according to claim 16, wherein the electrostatic protection circuit further comprises a switch module, and wherein an input terminal of the switch module receives the electrostatic detection signal, and wherein a first output terminal of the switch module is electrically connected to the clock signal terminal of the D flip-flop, and wherein the second output terminal of the switch module outputs the fault detection signal;
   wherein the input terminal of the switch module is electrically connected to the first output terminal or the second output terminal.

18. The display terminal according to claim 17, wherein the switch module is composed of a register, and wherein the input terminal of the switch module is electrically connected to the first output terminal when a setting bit of the register is at the low electrical potential, and wherein the input terminal of the switch module is electrically connected to the second output terminal when the setting bit of the register is at the high electrical potential.

19. The display terminal according to claim 18, wherein the clamping module and the switch module are both positioned in the power management unit.

20. The display terminal according to claim 18, wherein the clamping module and the switch module are both positioned in the level shift unit.

* * * * *